US005734575A

United States Patent [19]
Snow et al.

[11] Patent Number: 5,734,575
[45] Date of Patent: Mar. 31, 1998

[54] METHOD AND APPARATUS FOR DETECTING HIGH-IMPEDANCE FAULTS IN ELECTRICAL POWER SYSTEMS

[75] Inventors: Peter B. Snow, Colorado Springs, Colo.; Alexander P. Apostolov; Jefferson D. Bronfeld, both of Binghamton, N.Y.

[73] Assignee: New York State Electric & Gas Corp., Binghamton, N.Y.

[21] Appl. No.: 605,826

[22] Filed: Feb. 23, 1996

Related U.S. Application Data

[62] Division of Ser. No. 141,308, Oct. 22, 1993, Pat. No. 5,537,327.

[51] Int. Cl.⁶ .......................... G06F 15/22; G01R 31/08
[52] U.S. Cl. .......................... 364/482; 364/481; 364/483; 361/91; 361/92; 361/93
[58] Field of Search .................................. 364/483, 482, 364/481, 492; 395/907, 915, 21–23; 324/508, 509; 361/93, 76, 30, 91–92

[56] References Cited

U.S. PATENT DOCUMENTS

| 4,694,402 | 9/1987 | McEachern et al. | 364/487 |
| 5,452,223 | 9/1995 | Zuercher et al. | 364/483 |

OTHER PUBLICATIONS

Ebron et al., "A neural network approch to the detection of incipient faults on power distribution feeders", IEEE Transactions on Power Deliver, vol. 5, No. 2, Apr. 1990.

"A digital signal processing algorithm for detecting faults on power distrubtion feeders", Russell et al; IEEE Transctions on Power Delivery, vol. 4, No. 1, Jan. 1989.

"Neural network based techniques for distribution line condition monitoring"; Johns et al; IEEE Transctions on Power Delivery, Mar. 1995.

*Primary Examiner*—Emanuel T. Voeltz
*Assistant Examiner*—Kaminis Shah
*Attorney, Agent, or Firm*—Salzman & Levy

[57] ABSTRACT

The present invention features a method and apparatus for detecting and enabling the clearance of high impedance faults (HIFs) in an electrical transmission or distribution system. Current in at least one phase in a distribution system is monitored in real time by sensors. Analog current signature information is then digitized for processing by a digital computer. Zero crossings are identified and current maxima and minima located. The first derivatives of the maxima and minima are computed and a modified Fast Fourier Transform (FFT) is then performed to convert time domain to frequency domain information. The transformed data is formatted and normalized and then applied to a trained neural network, which provides an output trigger signal when an HIF condition is probable. The trigger signal is made available to either a network administrator for manual intervention, or directly to switchgear to deactivate an affected portion of the network. The inventive method may be practiced using either conventional computer hardware and software or dedicated custom hardware such as a VLSI chip.

8 Claims, 6 Drawing Sheets

```
% HIZPROC
% Developed by Dr. Peter B. Snow for NYSEG  March 9, 1993
% enter a file for processing - for example \ksc\hiz42_3.dat
% now put the file in vector a - for example a = hiz42_3
% now type in hizproc to activate this processing program
% clear the old matrices
clear b cl c2;
% first get the size of the input vector
[jd, ja] = size(a);
% now shift the signal to the origin y=0
avg1 = mean(a);
a = a - avg1;
%now find the element numbers of the zero current crossings
k = 1;
for i=1:jd-1;
   if a(i) < 0.0;
      if a(i+1) > 0.0;
         b(k) = i;
         k = k + 1;
      end;
   end;
end;
[jd, ja] = size(b);
k = 1;
% now find maximum values for each cycle
for i = 1:ja-1;
   j1 = b(i);
   j2 = b(i+1);
   c1(k) = max(a(j1:j2));
   c2(k) = min(a(j1:j2));
   k = k + 1
end;
% now take first derivative of max, min vectors
e1 = diff(c1);
e2 = diff(c2);
% now take the FFT and convert to power spectrum
g1 = fft(e1, 512);
g2 = fft(e2, 512);
pg1 = g1 .*conj(g1) / 512;
pg2 = g2 .*conj(g2) / 512;
sumfft1 = sum(pg1);
sumfft2 = sum(pg2);
sumfft = ( sumfft1 + sumfft2 ) / 2;
```

*Figure 3*

Series 1 = Phase B of 13 kV Line - Dropped on Ice
Series 2 = Phase B of 13 kV Line ations.
METHOD AND APPARATUS FOR DETECTING HIGH-IMPEDANCE FAULTS IN ELECTRICAL POWER SYSTEMS This is a divisional of application Ser. No. 08/141,308 filed on Oct. 22, 1993, now U.S. Pat. No. 5,537,327.

FIELD OF THE INVENTION

The invention pertains to the detection of faults in an electrical power system and more particularly, to the detection of high-impedance faults in power transmission and distribution systems caused by downed conductors, tree limbs across conductors and the like.

BACKGROUND OF THE INVENTION

In the electrical power generation and distribution industry, monitoring transmission and distribution networks for fault conditions is very important. The term distribution network is used herein to refer to any electrical power transmission or distribution facility. Moreover, a fault condition is any abnormal (unexpected) current-conducting path in a distribution network. Fault conditions often present danger to people and property. They also waste electrical energy.

One type of fault is a bolted (short-circuit) fault of one or more legs of a distribution network to another leg thereof or to ground. This type of low-impedance (low-Z) fault condition is easily detected by conventional circuit overcurrent protective devices such as fuses or circuit breakers. In other words, a complete short circuit (a low-impedance path) usually trips a circuit breaker or blows a fuse. A circuit of the distribution network experiencing such a fault condition is quickly removed from service until such time as repairs can be effected (i.e., until the fault is cleared).

Another type of fault condition occurs when an unintended high impedance (high-Z) conductive path occurs between transmission line legs or between one leg and ground. Such high-Z paths may occur when a tree limb or the like falls across a transmission line or when a single leg of a transmission line breaks (due to ice or wind, for example) and touches the ground. Generally, a single conductor of the distribution network dropping to the ground will not create a short circuit, but will continue to allow current flow at a relatively low rate. Such current flow often causes arcing. This condition presents a great danger of electrocution to people or animals happening across the downed conductor. The arcing can also result in fires.

A problem constantly plaguing the electrical power industry is finding an effective way to differentiate between a high-Z fault (HIF) condition and similar effects caused by changes in the loads attached to the distribution network. In addition to load switching events, power factor correcting capacitor banks are frequently switched on and off the network and transformer taps are automatically changed to keep the network voltage constant. Both of these events also create conditions on the network which may appear similar to an HIF condition. Any effective system for detecting HIFs must be able to distinguish fault conditions from normal load switching events. A system which ignores legitimate HIF conditions risks the aforementioned dangers while a system which falsely trips in response to normal load switching events can wrack havoc with consumers relying on uninterrupted electrical service. Interruption of electrical service to certain manufacturing processes, for example, may destroy work-in-process and result in large expense to the manufacturer. An interruption of medical apparatus can also be inconvenient at best, and disastrous at worst.

HIF detection solutions as simple as lowering the trip points of conventional circuit protective devices have been tried. Because HIF-drawn current is often a very small percentage of the total network current, this solution has done nothing more than cause excessive service interruptions. Most HIF research has focused upon the problem of finding detectable differences in measurable parameters in a distribution network under HIF and normal load switching conditions. Some of the parameters measured and compared have included phase current, ground current, ratio of ground current to positive sequence current, and frequency spectra—both near line frequency (typically 60 Hz.) and at higher harmonic relationships to line frequency.

One system with potential for detecting HIFs is disclosed in U.S. Pat. No. 5,223,795 issued to Frederick K. Blades, titled "Method and Apparatus for Detecting Arcing in Electrical Connections by Monitoring High Frequency Noise". Blades discloses a system wherein high-frequency noise caused by arcing is detected and, when measured above a pre-programmed threshold level, trips a circuit protective device. While the Blades system is intended for residential branch circuit uses, it is representative of a class of HIF detection strategies relying on high-frequency noise for use in power distribution networks. These techniques have not proven effective in the detection of HIFs, since noise generated by HIFs varies widely in both spectrum and intensity. In addition, capacitor banks, automatically switched on and off the network for power factor correction, tend to short the high-frequency noise signals to ground, adding additional uncertainty to the detection and analysis process.

Another approach to HIF detection is taught in U.S. Pat. No. 5,216,621 issued to Richard T. Dickens, titled "Line Disturbance-Monitor and Recorder System". Dickens discloses a system comprising analog current and/or voltage sensors placed at selected positions in a distribution network. Analog signals from the detectors are digitized by analog-to-digital (A/D) converters and presented to a high-speed digital signal processor (DSP) as digital sample words. The DSP computes both the real and imaginary phasor components of the operating parameter or parameters. These phasor components are then used to calculate various measures of power transmission performance according to known phasor equations. Trigger means implemented within the DSP provides an output signal when pre-programmed limits of a measured or calculated quantity are exceeded. Memory in cooperation with the DSP captures and stores digital sample words associated with abnormal events for future analysis. The Dickens apparatus appears to be expensive to build and, even with a state-of-the-art DSP, the system may only detect HIFs with well-known characteristics. Each installation on a network may have to be individually calibrated to the characteristics of that network and, as the loads changed on the network (e.g., by adding or removing power customers), the system would have to be re-calibrated.

A third approach to HIF detection is disclosed in U.S. Pat. No. 4,878,142 issued to Sten Bergman, et al., titled "High Resistance Ground Fault Protection". Bergman discloses a system for analyzing the non-harmonic components of phase currents. A estimate of Fourier coefficients is computed, thereby transforming the time-domain information into the frequency domain. Both the original digitized signals and the transformed frequency domain signals are applied to detection circuitry. Logical decisions based on comparison to known fault parameters are made and a fault-indicating trip signal is provided when appropriate. The Bergman system suffers from many of the same shortcomings as the aforementioned Dickens system. The Bergman system must be calibrated to each network and re-calibrated when the load profile on the network changes.

Yet a fourth HIF detection system is described in "A Neural Network Approach to the Detection of Incipient Faults on Power Distribution Feeders", paper No. 89 TD 377-3 PWRD, S. Ebron, D. Lubkemen and M. White (1989). That HIF detection system relies on the monitoring, digitization, and comparison of voltage and current conditions in the distribution network. The mechanism for deciding whether an event is an HIF or a normal load switching event is a partially or fully-trained neural network. The 200-node neural network described by Ebron et al. is trained using data obtained from a computer-simulated distribution network using the Electromagnetic Transients Program (EMTP) by Systems Control, Inc. Data is collected for ten cycles (two subsequent zero-crossings going from negative to positive) of simulated operation. Digitized data is pre-processed to extract features such as peak transient current over three phases, and phase currents immediately before and after the occurrence of a detected transient. The extracted feature vector representing ten cycles of simulated network operation is then applied to a neural network. The network, once at least partially trained, then identifies patterns in the data as either HIF or normal load switch events. A trigger signal can be generated when an HIF is detected.

It is therefore an object of the present invention is to provide a method and apparatus for monitoring an electrical power distribution network and for distinguishing HIF conditions from normal load, capacitor bank or transformer tap switching conditions with extremely high accuracy.

It is a further object of the invention to produce a system self-adaptable to a variety of networks and one that need not be calibrated for changes in load on the network.

It is still a further object of the invention to provide a self-contained, low-cost, single-chip hardware implementation of the inventive method for use either as a standalone HIF monitor, or as an integral part of a circuit-interrupting device for completely self-contained fault clearing.

SUMMARY OF THE INVENTION

In accordance with the present invention, there is provided a method and apparatus for detecting and clearing high impedance faults (HIFs) in an electrical transmission or distribution system. Current in at least one phase in a distribution system is monitored in real time by sensors. Analog current/voltage signature information is then digitized for processing by a digital computer. Zero crossings are identified and current maxima and minima for each cycle located. The first derivatives of the maxima and minima are computed and a modified Fast Fourier Transform (FFT) is then performed to convert time domain to frequency domain information. The transformed data is formatted and normalized and then applied to a trained neural network, which provides an output trigger signal when an HIF condition is probable. The trigger signal is made available to either a network administrator for manual intervention, or directly to switchgear to deactivate an affected portion of the network. The inventive method may be practiced using either conventional computer hardware and software or dedicated custom hardware such as a VLSI chip.

BRIEF DESCRIPTION OF THE DRAWINGS

A complete understanding of the present invention may be obtained by reference to the accompanying drawings, when taken in conjunction with the detailed description thereof and in which:

FIG. 3 is a program listing of the pre-processing commands;

DESCRIPTION OF THE PREFERRED EMBODIMENT

Generally speaking, the invention relates to the field of fault detection in electrical power transmission and distribution systems and networks. It should be understood that the terms "power distribution network" or "network" are hereinafter used to refer to any alternating current electrical transmission or distribution system or facility. More specifically, there is disclosed a system for the identification of high-impedance faults (HIFs) which is capable of differentiating with high accuracy fault conditions drawing as small a current as 200 mA in a power distribution network. HIF conditions may, however, draw currents as high as 700 amps. The system is applicable to both single-phase and poly-phase networks.

Figure 1:
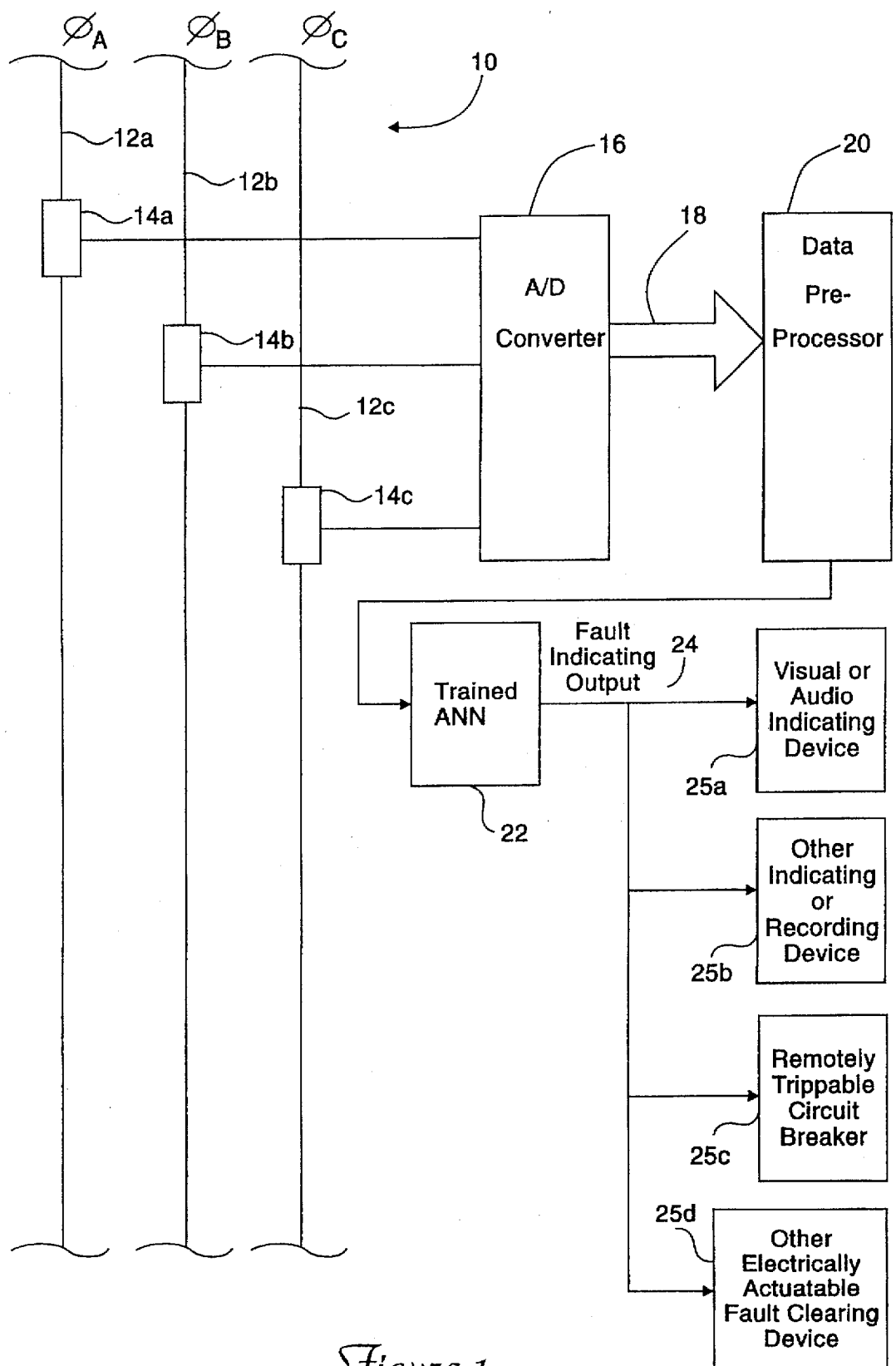
FIG. 1 is a functional block diagram in accordance with the present invention.

Referring now to FIG. 1, there is shown a functional block diagram of the present invention. A portion of a typical three-phase power distribution network is shown generally at reference numeral 10. Phase conductors 12a, 12b and 12c of distribution network 10 each are monitored by current transformers 14a, 14b and 14c, respectively. Since current transformers are well known in the art, it should be noted that any current transformer or transducer capable of generating a low-noise analog signal representative of the current may be employed. Typically a Model No. MF12540 MF slip-over bushing current transformer manufactured by Associated Engineering Corp. could be used. The HIF detection system of the present invention could be used effectively to monitor a single phase network or a single phase of a poly-phase distribution network.

Analog signals representing phase currents from phase conductors 12a, 12b, and 12c monitored by current transformers 14a, 14b and 14c are provided to inputs of an analog-to-digital (A/D) converter 16. A/D converter 16 is a three or more channel device with 12 bit resolution, typically a Model No. DAS-50 manufactured by Keithley Metrobyte. Sampling rate is approximately 5 kHz. Digitized representations of analog phase currents are applied from A/D converter 16 to a pre-processor 20 via data bus 18. Pre-processor 20 performs several mathematical and data formatting operations described in more detail hereinbelow.

Pre-processed data is then applied to the input of a trained artificial neural network (ANN) 22. An ANN is a computer model of the parallelism and interconnectedness of the human brain. Connectionist models exist which have the ability to derive "rules" by analyzing patterns. The ANN differs from more conventional expert systems or general artificial intelligence approaches in that the latter require the existence of well-defined rules as a prerequisite for effective operation. The training of an ANN is the process whereby the ANN learns to associate input states to output states by adjusting weights and biases. In the training mode, the expected or desired outcome based upon the applied data is used. If training data covering a broad enough range of conditions is provided, the ANN eventually self-develops a pattern relating inputs to outputs allowing it to analyze any applied unknown data. A trained ANN is therefore highly effective at pattern recognition tasks. That is, pattern recognition is accomplished at extremely high speed and with a high probability of a correct outcome, based upon the applied data.

Training the ANN 22 is necessary to establish the "rules" or weights to be used to classify events occurring on the network as HIFs or normal switching events. Training is accomplished by providing multiple sets of known data representing both HIF and normal network conditions to the ANN 22 along with the correct "answers" corresponding to each data set. Data sets my be compiled using computer simulation techniques or may consist of actual field-collected data corresponding to both fault and no-fault conditions of distribution networks.

Actual field-collected data and superposition combinations of field data were used to train the ANN 22 of the present invention. Over 300 sets of field-collected and super position data were used for the training. A typical training data set consisted of 2860 data points representing 10 seconds of sampling time on a real or simulated network. Digitization frequency was 5000 samples/second. The training data sets were pre-processed essentially as will be described in detail hereinbelow. The backprapogation of errors method was the learning technique chosen to train ANN 22 of the present invention. A learning rate of 0.05 and a momentum (a method of changing weights based on a previous weight) of 0.1 were chosen. Once trained (i.e., appropriate weights established), an ANN my be duplicated and distributed and applied in its intended application as a fixed-weight (non-trainable) ANN.

In the preferred embodiment, ANN 22 comprises 386-MATLAB software version 3.5M from Mathworks, Inc. operating on an IBM® compatible personal computer under the Microsoft® DOS operating system version 5.0 or greater.

ANN 22 continuously analyzes data from pre-processor 20 and provides an output signal 24 which indicates either a normal condition or an HIF. Signal 24 may be used to alert a network administrator (not shown) of a potential HIF by means of indicating/recording devices 25a and/or 25b. Optionally signal 24 may be utilized directly to clear the assumed fault by sending a trip signal to a protective circuit interrupter 25c or 25d as is well known in the art.

Figure 2:
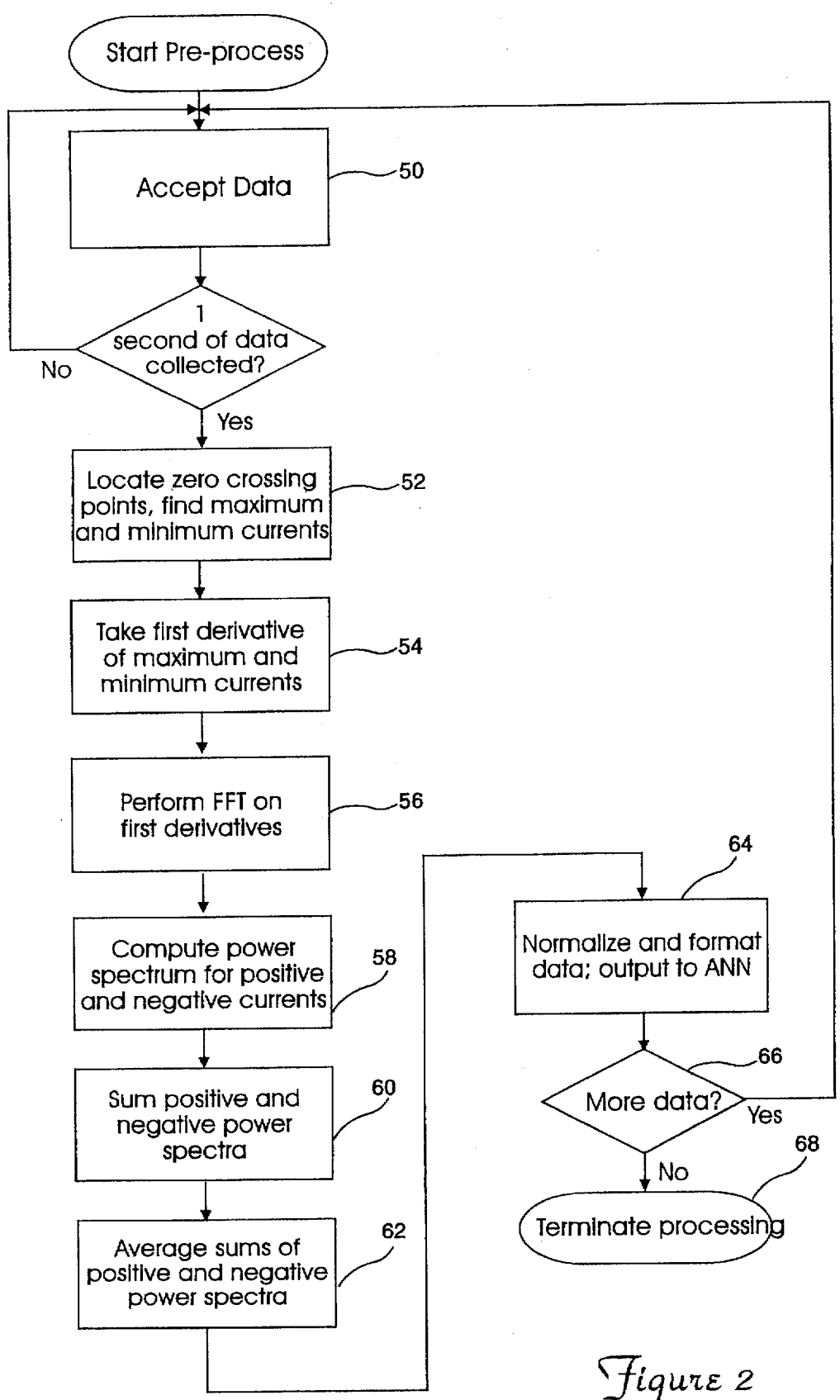
FIG. 2 is a flow chart showing the pre-processing steps of the method of the present invention.

Refer now also to the flow chart of FIG. 2 and also to the program listing of FIG. 3, which represents the code applied to ANN 22. In learning mode operation, pre-processor 20 first accumulates approximately 5000 digitized current data points for each line phase 12a, 12b and 12c being monitored. This represents approximately one second of network operation, step 50. Cycles are identified by their zero-crossing points. Zero-crossing points are identified in the data for each phase conductor 12a, 12b and 12c. This is accomplished by calculating when the current crosses from negative to positive sign. The maximum and minimum current for each cycle is determined, step 52. The first derivative (i.e, the rate of change with respect to time) of the maximum and minimum current values is then taken, step 54.

Figure 5A:
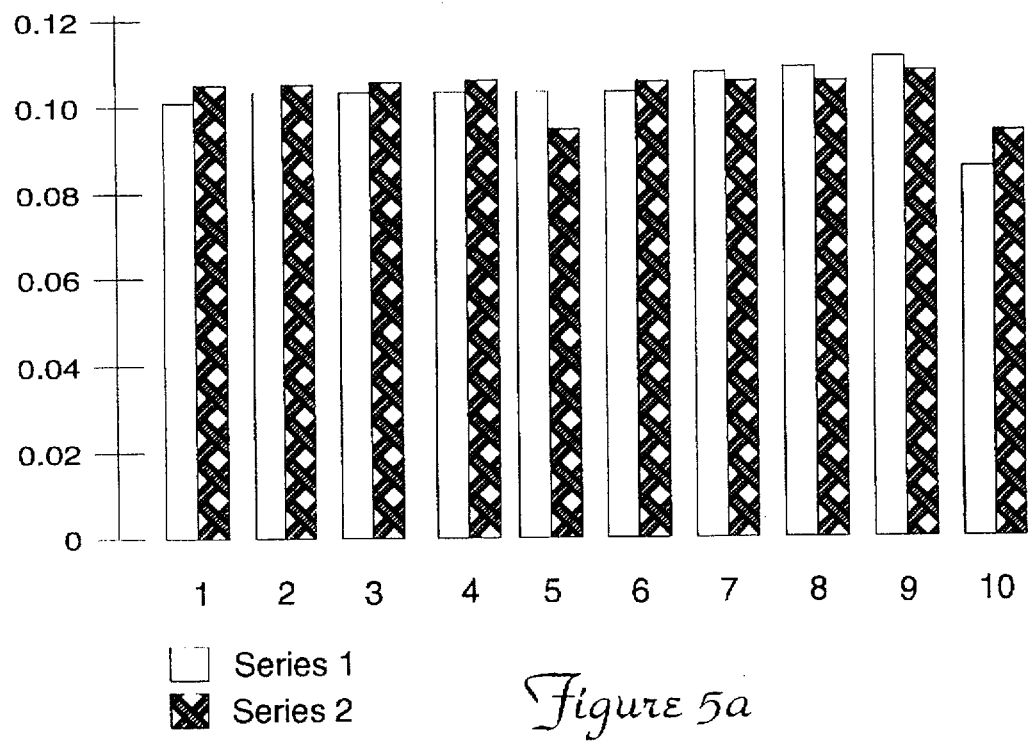
FIGS. 5a and 5b, respectively, show fault detection probability without and with first derivative calculation.
Figure 5B:
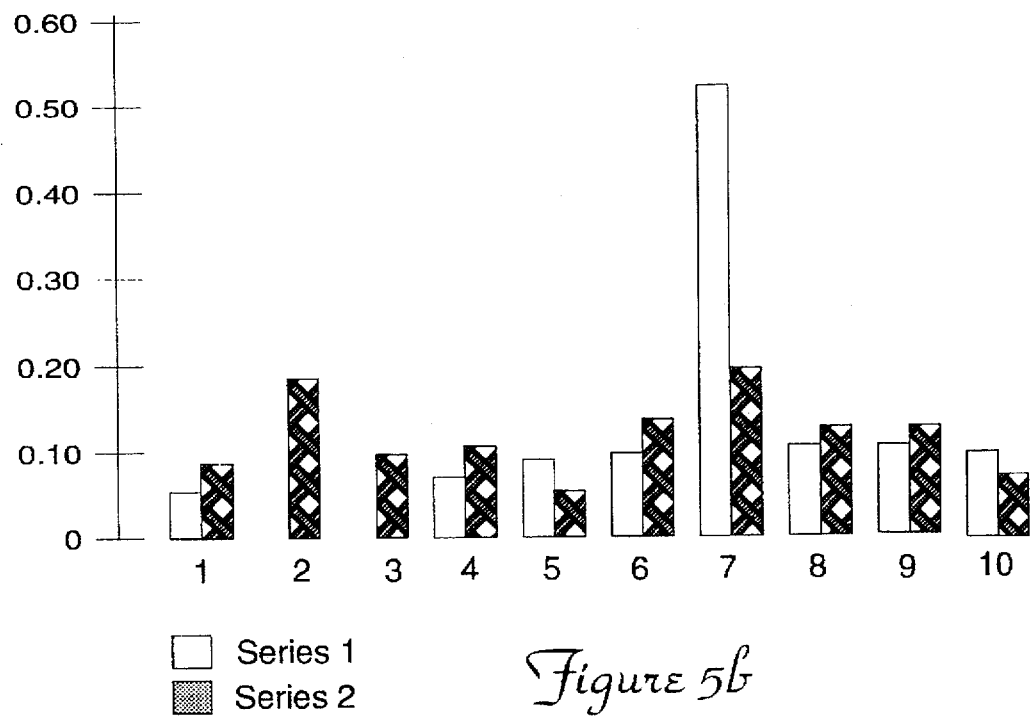

It has been found through experimentation with both simulated and field recorded data that calculating the first derivative is essential to the process of accurately detecting HIFs. For purposes of illustrating the importance of the first derivative in detecting a high-impedance fault, refer now also to FIGS. 5a and 5b. There are shown bar graphs of ANN output (relative value or relative HIF probability) vs. time for a 10 second period for an actual HIF condition occurring on a single phase of a 13 kV three-phase transmission line (not shown). For this fault, the phase B leg of the transmission line was dropped onto ice. Series 1 data shows the faulted condition while Series 2 data shows the line under no fault conditions. In FIG. 5a the first derivative has not been calculated and, as may be seen, there is little difference in the relative value of Series 1 or Series 2 data. In FIG. 5b, identical data is plotted. However, the first derivative has been calculated, and consequently there is pronounced difference in the output of the ANN 22 in response to the HIF (relative value of the Series 1 data).

A Fast Fourier Transform (FFT) is then performed on each of the two first derivatives, step 56 (FIG. 2). Next, a power spectrum is computed for both positive and negative currents, step 58. This is accomplished by taking the product of the FFT with its complex conjugate. Total power is calculated by summing the power spectrum for the one second data window, step 60. The positive and negative summed powers are then averaged, step 62. The averaged power thus calculated is then formatted and scaled for compatibility with the non-linear transfer function of the trained ANN 22, step 64. This is accomplished by representing each one second averaged power as the number of standard deviations from the average Z-scaling. The steps are repeated continuously, if additional data is processed, step 66, starting again with step 50. Processing terminates, step 68 when all data has been exhausted.

Figure 4A:
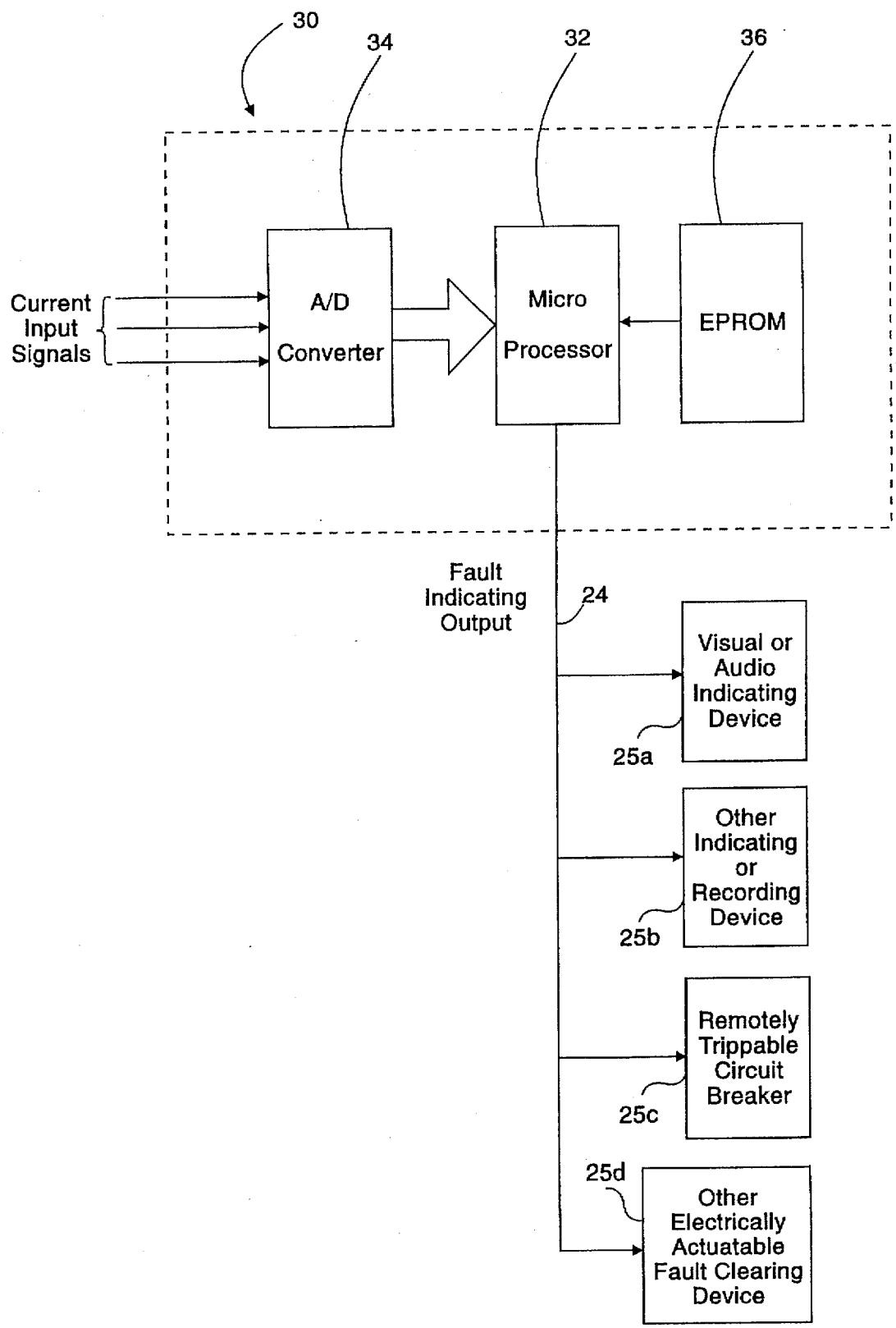
FIGS. 4a and 4b show block diagrams of alternate hardware embodiments of the present invention.
Figure 4B:
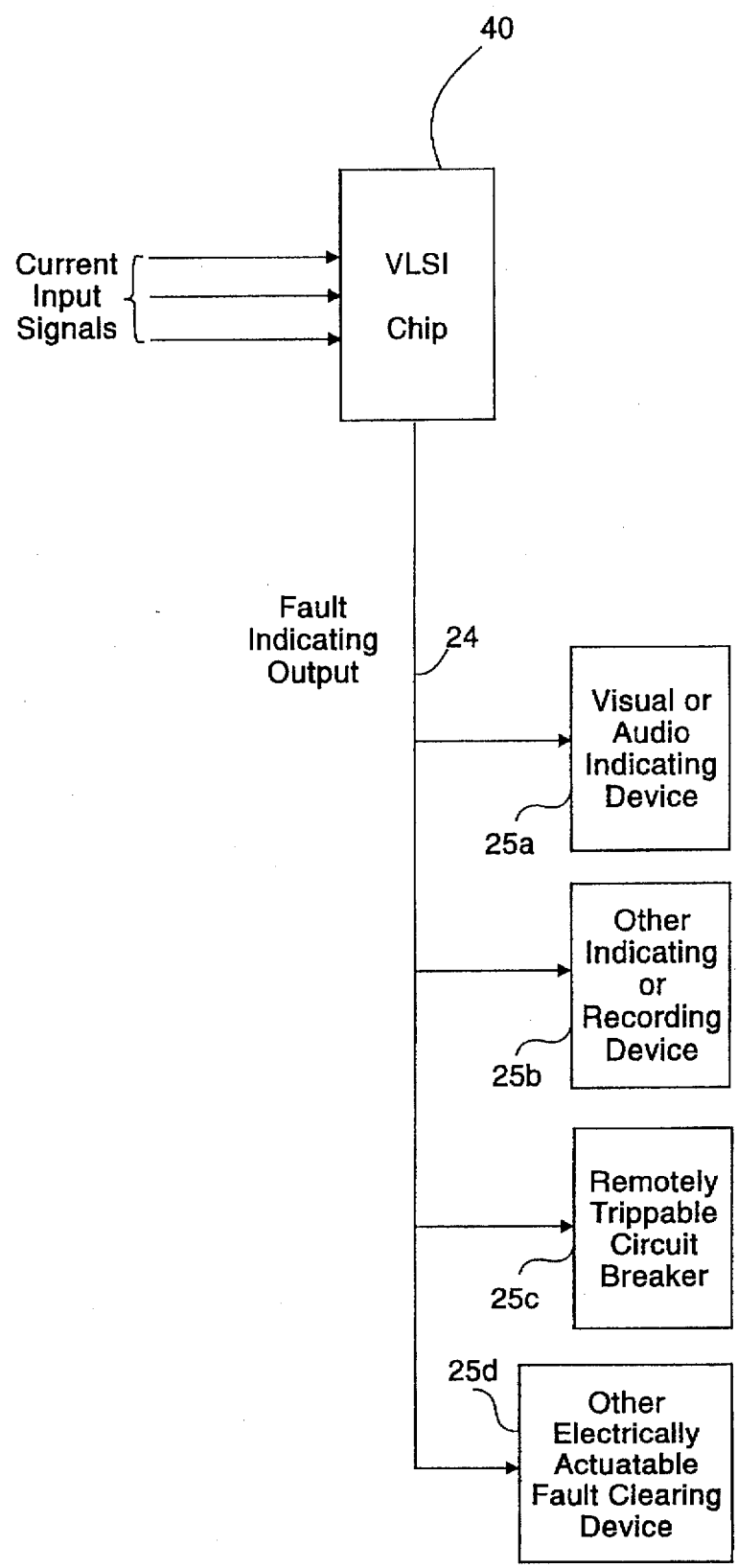

Referring to FIGS. 1, 4a and 4b, a fault indicating output signal 24 is generated by trained ANN 22 and provided to signaling/recording or fault clearing devices 25a, 25b, 25c and 25d. These signaling/recording and/or fault clearing devices are well known in the art and may be configured in any suitable combination. A visual indicator or audible annunciator 25a are used to alert operating personnel (not shown) of the presence of a fault. This fault indication may prompt action to clear the fault by manually deenergizing the faulted line. A recording device 25b such as a digital fault recorder, well known in the art, may also be attached to monitor output signal 24. In other installations, a remotely trippable circuit breaker 25c or other electrically actuatable fault clearing device 25d may operate automatically upon receipt of the fault indicating output signal 24 to clear the faulted line.

Alternate embodiments of the present invention may be implemented wherein the entire A/D converter 16, data pre-processor 20 and ANN 22 are implemented as a dedicated self-contained device. FIG. 4a shows generally, at reference numeral 30, the functions of A/D converter 16 (FIG. 1), data pre-processor 20 and ANN 22 all implemented using a commercial microprocessor 32, A/D chip(s) 34 and a commercial EPROM 36 customized with all necessary program instructions. FIG. 4b shows an embodiment where A/D converter 16, data pre-processor 20 and ANN 22 are all implemented as a single VLSI chip or equivalent chip shown as reference numeral 40.

In yet another embodiment of the present invention, the VLSI or equivalent chip may be packaged as part of a fault-clearing or circuit protecting device. Output from the HIF detecting circuit chip would then trip the circuit protecting device directly.

In still another embodiment of the present invention, input data leading to an HIF determination by the ANN 22 would be captured and stored. Such data would then be used either to further train other ANNs (not shown) or, in cooperation with other analysis software not part of the present invention, to create a set of heuristic "rules" in a form usable by more general expert systems. An expert system (e.g., a "fuzzy logic" inference engine) using rules so derived could replace the ANN 22 as the HIF decision-making component of the present invention.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequent appended claims.

What is claimed is:

1. A method for detecting high impedance faults on a power line of a high voltage distribution system, comprising:
   a) sensing a plurality of cycles of current attributable to a power line in a high voltage distribution system and generating a signal representative thereof;
   b) detecting changes in cycle-to-cycle positive and negative peaks of the waveform of said current; and
   c) initiating an event only when said changes, demonstrating behavior characteristic of high impedance faults, are detected.

2. The method for detecting high impedance faults on a power line in accordance with claim 1, wherein said initiating step (c) results in operating a circuit clearing device.

3. The method for detecting high impedance faults on a power line in accordance with claim 2, wherein said clearing device is a clearing device disposed along said power line.

4. The method for detecting high impedance faults on a power line in accordance with claim 1, wherein said initiating step (c) results in operating an indicating device.

5. A method for detecting high impedance faults on a power line of a high voltage distribution system, comprising:
   a) sensing a plurality of cycles of voltage attributable to a power line in a high voltage distribution system and generating a signal representative thereof;
   b) detecting changes in cycle-to-cycle positive and negative peaks of the waveform of said voltage; and
   c) initiating an event only when said changes, demonstrating behavior characteristic of high impedance faults, are detected.

6. The method for detecting high impedance faults on a power line in accordance with claim 5, wherein said initiating step (c) results in operating an indicating device.

7. The method for detecting high impedance faults on a power line in accordance with claim 5, wherein said initiating step (c) results in operating a circuit clearing device.

8. The method for detecting high impedance faults on a power line in accordance with claim 7, wherein said clearing device is a clearing device disposed along said power line.

* * * * *